United States Patent [19]

Bates

[11] Patent Number: 4,642,577
[45] Date of Patent: Feb. 10, 1987

[54] INJECTION-LOCKED WAVEGUIDE OSCILLATOR

[75] Inventor: Robert N. Bates, Crawley, England

[73] Assignee: U.S. Philips Corporation, New York, N.Y.

[21] Appl. No.: 837,622

[22] Filed: Mar. 10, 1986

[30] Foreign Application Priority Data

Mar. 22, 1985 [GB] United Kingdom ............... 8507520

[51] Int. Cl.$^4$ .................... H03B 7/14; H03B 9/14
[52] U.S. Cl. .................... 331/47; 331/54;
  331/55; 331/56; 331/96; 331/107 P; 331/172
[58] Field of Search .............. 331/46, 47, 54, 55,
  331/96, 107 DP, 107 P, 172, 56

[56] References Cited

U.S. PATENT DOCUMENTS 4,568,890  2/1986  Bates ............................. 331/96

OTHER PUBLICATIONS

Perlman et al., "Criterion for Nonreciprocal Injection Locking of Bilateral Microwave Oscillators", IEEE Trans. Microwave Theory and Techniques, vol. MTT-18, No. 8, Aug. 1970, pp. 507–508.

Talwar, "A Dual-Diode 73-GHz Gunn Oscillator", IEEE Trans. Microwave Theory and Techniques, vol. MTT-27, No. 5, May 1979, pp. 510–512.

Primary Examiner—Siegfried H. Grimm
Attorney, Agent, or Firm—Robert J. Kraus

[57] ABSTRACT

An injection-locked waveguide oscillator comprises a first diode (3) having a free-running fundamental frequency above the local cut-off frequency of the waveguide (1) and a second diode (4) having a fundamental frequency below and a higher harmonic above the local cut-off frequency. The first diode (3) may be an IMPATT diode and the second diode (4) a Gunn diode. The free-running fundamental frequency of the first diode (3) is close to the higher harmonic of the second diode (4) so that the second diode (4) injection-locks the first (3). Locking in the reverse sense is inhibited by the inherent loss in conversion from the higher harmonic to the fundamental in the second diode (4), thus avoiding the need for a circulator or isolator. The two diodes (3, 4) preferably are mounted in a common waveguide (1) for a simple compact structure.

6 Claims, 1 Drawing Figure

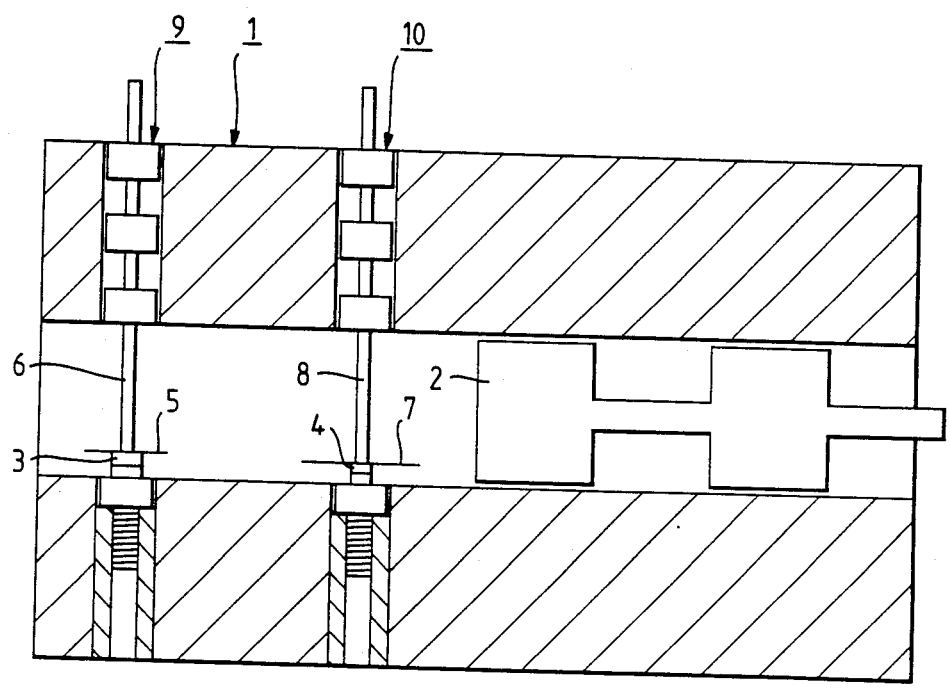

INJECTION-LOCKED WAVEGUIDE OSCILLATOR

BACKGROUND OF THE INVENTION

The invention relates to a microwave oscillator wherein a first oscillator diode is injection-locked with electromagnetic energy from a second oscillator diode. Such an arrangement may be used where the first diode has a higher output power at the desired frequency than the second diode but has, for example, poorer frequency stability and/or more noise. The first diode may for example be an IMPATT diode and the second diode may for example be a Gunn diode. The invention is particularly suitable for providing an oscillator with an output frequency in the mm-wave range, for example 94 GHz, in which it is not otherwise readily possible to generate high-quality signals with solid-state devices at relatively high power levels.

The injection-locking of microwave oscillators is well known. (For an example of an injection-locked oscillator for the mm-wave range, see "Generating power at mm-wave frequencies" by N. B. Kramer and R. A. Johnson, Microwaves & RF, May 1984, pages 243-249, particularly FIG. 14 and the related text on pages 245-246.) Where, as is usually the case, the injected locking signal is of the same frequency as the final output signal from the oscillator, it is necessary to provide a circulator or isolator between the higher-output diode and the source of the locking signal in order to ensure that the former does not lock the latter. This adds significantly to the cost of the oscillator and also increases its size.

The paper "Subharmonically Injected Phase-locked IMPATT-Oscillator Experiments" by C. H. Chien and G. C. Dalman, Electronics Letters, Vol. 6, No. 8 (Apr. 16, 1970), pages 240-241, discloses an oscillator comprising an IMPATT diode which is supplied with a subharmonic locking signal via a coaxial bias circuit including a low-pass filter adjacent the oscillator. The IMPATT diode oscillates at about 8.5 GHz, and the locking signal may be half, 1/6th or 1/9th of that frequency. The low-pass filter inhibits the propagation of microwave energy at the frequency of the IMPATT diode between that diode and the bias circuit (in each direction); an isolator and a further low-pass filter are additionally used between the first-mentioned filter and the locking source.

UK Patent Application No. GB 2 133 649 A discloses an injection-locked oscillator wherein an oscillator diode having a fundamental frequency below and a second harmonic frequency above the cut-off frequency of a waveguide in which the diode is disposed is injection-locked (via a resonant-cap coupling structure of the oscillator and a probe extending into the waveguide adjacent the cap) with a locking signal whose frequency is approximately equal to the free-running fundamental frequency of the diode.

SUMMARY OF THE INVENTION

According to the invention, a waveguide oscillator comprises waveguide cavity means, a first oscillator diode which is disposed in a first portion of the waveguide cavity means and which is operable to oscillate at a fundamental frequency above the cut-off frequency of the first portion of the waveguide cavity means, and a second oscillator diode which is disposed in a second portion of the waveguide cavity means and which is operable to oscillate at a fundamental frequency that is below the cut-off frequency of the second portion of the waveguide cavity means. The second oscillator that has a harmonic frequency above the cut-off frequency of the second portion of the waveguide cavity means. The harmonic frequency is approximately equal to the free-running fundamental frequency at which the first diode oscillates if the second diode is not oscillating. In operation the first diode receives electromagnetic energy at the harmonic frequency from the second diode whereby the fundamental frequency of the first diode is locked to the harmonic frequency.

Preferably, the first and second portions are contiguous so as to form a single waveguide cavity. This can constitute a particularly compact and simple structure. The second diode may be spaced along the waveguide cavity means from the first diode, being disposed longitudinally between the first diode and a short-circuit terminating the waveguide cavity means.

Preferably, the first and second portions have the same cut-off frequency.

It may be mentioned that it is known to power-combine a plurality of diodes in a single waveguide cavity. In that case, however, the diodes are closely similar to one another and oscillate at the same fundamental frequency.

BRIEF DESCRIPTION OF THE DRAWING

An embodiment of the invention will now be described, by way of example, with reference to the diagrammatic drawing, the sole FIGURE of which is a longitudinal view, partly in cross-section, of an oscillator embodying the invention.

DESCRIPTION OF THE PREFERRED EMBODIMENT

The oscillator comprises a length of rectangular waveguide 1 of uniform internal cross-section, terminated at one end (the right-hand end as drawn) by an adjustable short-circuit 2 (shown schematically), forming a waveguide cavity; the other end of the waveguide constitutes the output of the oscillator. First and second oscillator diodes 3 and 4 respectively are mounted in the waveguide on respective heat-sinks disposed in bores in the lower broad wall of the waveguide. The diodes are each located in the central longitudinal plane of the waveguide and are spaced along the waveguide, the second diode 4 being disposed longitudinally between the first diode 3 and the short-circuit 2. Each diode is coupled to the waveguide and to a respective DC bias supply by a resonant cap and post structure 5, 6 and 7, 8 respectively. The posts 6 and 8 extend through respective bores in the upper broad wall of the waveguide, aligned with the bores in the lower broad wall, and are fitted with spaced portions of relatively large diameter, DC-isolated from the waveguide housing, to form chokes 9 and 10 respectively.

The first diode 3 and the diameter of its associated resonant cap 5 are such that when a suitable DC bias is applied via the choke 9, the diode 3 oscillates at a fundamental frequency above the cut-off frequency of the waveguide 1. The diode 3 may be a diode with a relatively high output power at its fundamental frequency but with a relatively low Q-factor in the waveguide cavity, such as an IMPATT diode. The second diode 4 and the diameter of its associated resonant cap 7 are such that when a suitable DC bias is applied via the choke 10, the diode 4 oscillates at a fundamental frequency which is below the cut-off frequency of the waveguide 1 and which has a higher harmonic, for example the second harmonic, above the cut-off frequency. This harmonic frequency is approximately equal to the fundamental frequency at which the first diode 3 oscillates when the second diode 4 is not oscillating (for example when no DC bias is applied to the diode 4). The second diode 4 may be a diode having, at the harmonic frequency, a relatively low power output and a relatively high Q-factor in the waveguide cavity, such as a Gunn diode.

When a suitable DC bias voltage is supplied to each diode, the first diode 3 receives electromagnetic energy from the second diode 4 at the harmonic frequency, locking the fundamental frequency of the first diode to the harmonic frequency. The loss associated with the conversion in the second diode 4 of energy at the harmonic frequency to energy at its fundamental frequency of oscillation inherently provides isolation of the second diode 4 from the first diode 3, thereby preventing locking from occurring in the undesired reverse sense. The fact that the fundamental frequency of oscillation of the second diode is below the cut-off frequency of the waveguide may also inhibit any tendency that might otherwise be present for locking of the second diode by a subharmonic of the first diode. The invention thus avoids the need to use an isolator or circulator between the source of the locking signal and the injection-locked diode while using a locking signal of the same frequency as the fundamental of the injection-locked diode.

To maximize the locking range and the output power, the spacing of the two diodes from each other may be approximately half a wavelength at the fundamental frequency of the first diode 3, and the spacing of the second diode 4 from the short-circuit 2 may be approximately a quarter of a wavelength at that frequency. The short-circuit may be adjusted to optimize output power.

The above-described arrangement in which the two diodes are disposed in a common waveguide cavity of uniform cross-section is particularly compact and easy to manufacture, but the diodes may alternatively be disposed in distinct respective portions of waveguide which need not have the same cut-off frequency; if the portions are not contiguous, means such as a probe may be used to couple energy at the higher harmonic frequency of the second diode to the first diode. The fundamental frequency of the first diode should be above the local cut-off frequency of its waveguide portion, and the fundamental frequency of the second diode should be below, and its higher harmonic frequency above, the local cut-off frequency of its waveguide portion.

An oscillator embodying the invention may be used for CW or pulsed operation. In pulsed operation, the bias voltage for the first diode may be pulsed and the second diode may be operated continuously.

I claim:

1. A waveguide oscillator comprising waveguide cavity means, a first oscillator diode which is disposed in a first portion of the waveguide cavity means and which is operable to oscillate at a fundamental frequency above the cut-off frequency of the first portion of the waveguide cavity means, and a second oscillator diode which is disposed in a second portion of the waveguide cavity means and which is operable to oscillate at a fundamental frequency that is below the cut-off frequency of the second portion of the waveguide cavity means and that has a harmonic frequency above the cut-off frequency of the second portion of the waveguide cavity means, said harmonic frequency being approximately equal to the free-running fundamental frequency at which the first diode oscillates if the second diode is not oscillating, wherein in operation the first diode receives electromagnetic energy at said harmonic frequency from the second diode whereby the fundamental frequency of the first diode is locked to said harmonic frequency.

2. An oscillator as claimed in claim 1 wherein said first and second portions are contiguous so as to form a single waveguide cavity.

3. An oscillator as claimed in claim 2 wherein the second diode is spaced along the waveguide cavity means from the first diode, and is disposed longitudinally between the first diode and a short-circuit terminating the waveguide cavity means.

4. An oscillator as claimed in claim 1, 2 or 3 wherein said first and second portions have the same cut-off frequency.

5. An oscillator as claimed in claim 1, 2 or 3 wherein the first diode is an IMPATT diode.

6. An oscillator as claimed in claim 1, 2 or 3 wherein the second diode is a Gunn diode.

* * * * *